United States Patent [19]

Okubo et al.

[11] Patent Number: 4,518,914
[45] Date of Patent: May 21, 1985

[54] TESTING APPARATUS OF SEMICONDUCTOR WAFERS

[75] Inventors: Masao Okubo, Tokyo; Yasuro Yoshimitsu, Takatsuki; Fumio Nakai, Amagasaki, all of Japan; Oliver R. Garretson, Cupertino, Calif.

[73] Assignee: Japan Electronic Materials Corportion, Amagasaki, Japan

[21] Appl. No.: 404,055

[22] Filed: Aug. 2, 1982

[30] Foreign Application Priority Data

Aug. 3, 1981 [JP] Japan ................ 56-122135

[51] Int. Cl.³ .................... G01R 1/06; G01R 31/02
[52] U.S. Cl. ...................... 324/158 F; 324/72.5; 324/158 P
[58] Field of Search .......... 324/158 F, 158 P, 73 PC, 324/72.5; 339/117 P; 200/83 N

[56] References Cited

U.S. PATENT DOCUMENTS

| | | | |
|---|---|---|---|
| 3,866,119 | 2/1975 | Ardezzone et al. | 324/158 F |
| 3,996,517 | 12/1976 | Ferguson et al. | 324/158 F |
| 4,101,830 | 7/1978 | Greig | 324/158 F |
| 4,164,704 | 8/1979 | Kato et al. | 324/158 F |
| 4,321,533 | 3/1982 | Matrone | 324/158 F |
| 4,322,682 | 3/1982 | Schadwill | 324/158 F |
| 4,423,376 | 12/1983 | Byrnes et al. | 324/158 F |

*Primary Examiner*—Ernest F. Karlsen
*Assistant Examiner*—S. Baker
*Attorney, Agent, or Firm*—Wenderoth, Lind & Ponack

[57] ABSTRACT

A testing apparatus of semiconductor wafers includes a base plate and a probe card including probe needles, wherein the probe card is detachably affixed to the base plate under air suction, which is derived from a vacuum produced in an airtightly sealed space provided between the base plate and the probe card.

5 Claims, 5 Drawing Figures

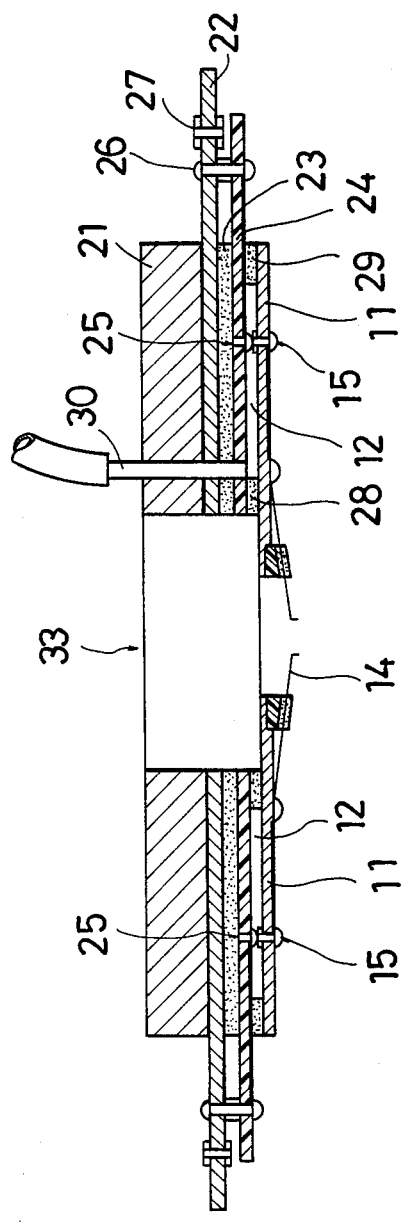
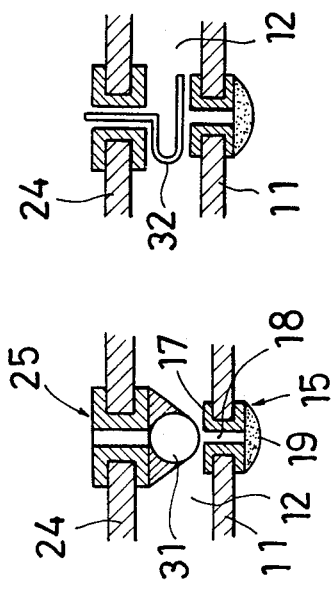

TESTING APPARATUS OF SEMICONDUCTOR WAFERS

BACKGROUND OF THE INVENTION

The present invention relates to a testing apparatus for examining a semiconductor wafer, and more particularly, to a testing apparatus for such use, the apparatus including a probe card holder unit whereby the probe card is softly mounted on the apparatus under air suction, without the use of any mechanical means, such as a plug and a jack.

In the manufacture of microelectronic devices including semiconductor wafer chips, the wafer chips must be tested prior to the application of terminal leads to them in order to ascertain if they function properly and reliably as end products. For such tests a tester including a probe card is employed, wherein the probe card is secured to a holder. The probe card includes a number of radially arranged probe needles, which are intended as terminal leads for testing purpose. A problem is involved in fixing the probe card to the holder with the use of conventional plugs and jacks through which the electrical connections are also made between the probe needles and an outer testing electric circuit. The number of the plugs and jacks, of course, corresponds to that of the probe needles on the probe card, and an increase in the number thereof increases the burden of fixing and detaching the probe card to and from the holder. Nevertheless, it was not a serious problem when the degree of circuit integration in the electronic devices was low and not so complex as that of the most recent ultra large LSIs. The recently developed microelectronic devices include commonly-called ultra LSIs or super LSIs, and the terminals thereof have tremendously increased in number, such as more than 200. Accordingly, the probe card must have a corresponding number of probe needles, which requires an increased number of plugs and jacks. This increases the toil of connecting the probe card to the testing device. Particularly, the problem is that a relatively large force must be imparted to the probe card so as to enable it to be connected to and disconnected from, the holder. As a result, it frequently happens that the probe card is broken or damaged.

OBJECTS AND SUMMARY OF THE INVENTION

The present invention aims at solving the problems pointed out above with respect to the conventional testing system, and it is an object of the present invention to provide an improved testing apparatus for examining semiconductor wafers, the apparatus including a probe card holder unit allowing a probe card to be readily mounted and dismounted without imparting a detrimentally large force thereto.

Another object of the present invention is to provide an improved testing apparatus for examining semiconductor wafers, wherein the electrical connection between the probe card and its holder is readily accomplished with the minimum electrical resistance.

Other objects, features and advantages of the present invention will become more apparent from the following description when taken in connection with the accompanying drawings which show, for the purpose of illustration only, one embodiment in accordance with the present invention.

According to one advantageous aspect of the present invention there is provided a testing apparatus which includes a base plate having an opening at its center, a plurality of lead-out terminals and connecting pins, wherein the lead-out terminals and connecting pins are electrically connected. In addition, the testing apparatus includes an elastic sheet affixed to the base plate by means of the connecting pins, the elastic sheet also including an opening concentric with the opening of the base plate. The elastic sheet is provided with at least two sealing sheets on its bottom surface, wherein the sealing sheets are located to produce a space therebetween. The elastic sheet includes terminal contacts whose top portions protrude into the space, and the terminal contacts are electrically connected to the connecting pins. The space is intended to allow a vacuum to be produced therein, and to this end an air suction means is passed through the base plate and the elastic sheet and communicated with the space. Also the testing apparatus of the invention includes a probe card having an opening at its center, concentrically located with the opening of the base plate, and a plurality of probe needles, which are individually connected to their own terminal contacts. The top portions of these terminal contacts also protrude into the space in which they come into contact with the terminal contacts of the elastic sheet when the probe card is placed on the sealing sheets, and held thereto under the efect of the suction provided by the air suction means.

According to another advantageous aspect of the present invention, the testing apparatus described above further includes a second elastic layer between the base plate and the elastic sheet.

BRIEF DESCRIPTION OF THE DRAWINGS

FIG. 2 is a vertical cross-section through the testing apparatus of FIG. 1, taken along the line II—II therein;

FIG. 3 is a fragmentary cross-section on an enlarged scale showing one example of the terminal contacts included in the present invention;

FIG. 4 is a fragmentary cross-section on an enlarged scale showing another example of the terminal contacts.

DETAILED DESCRIPTION OF THE INVENTION

Figure 1:
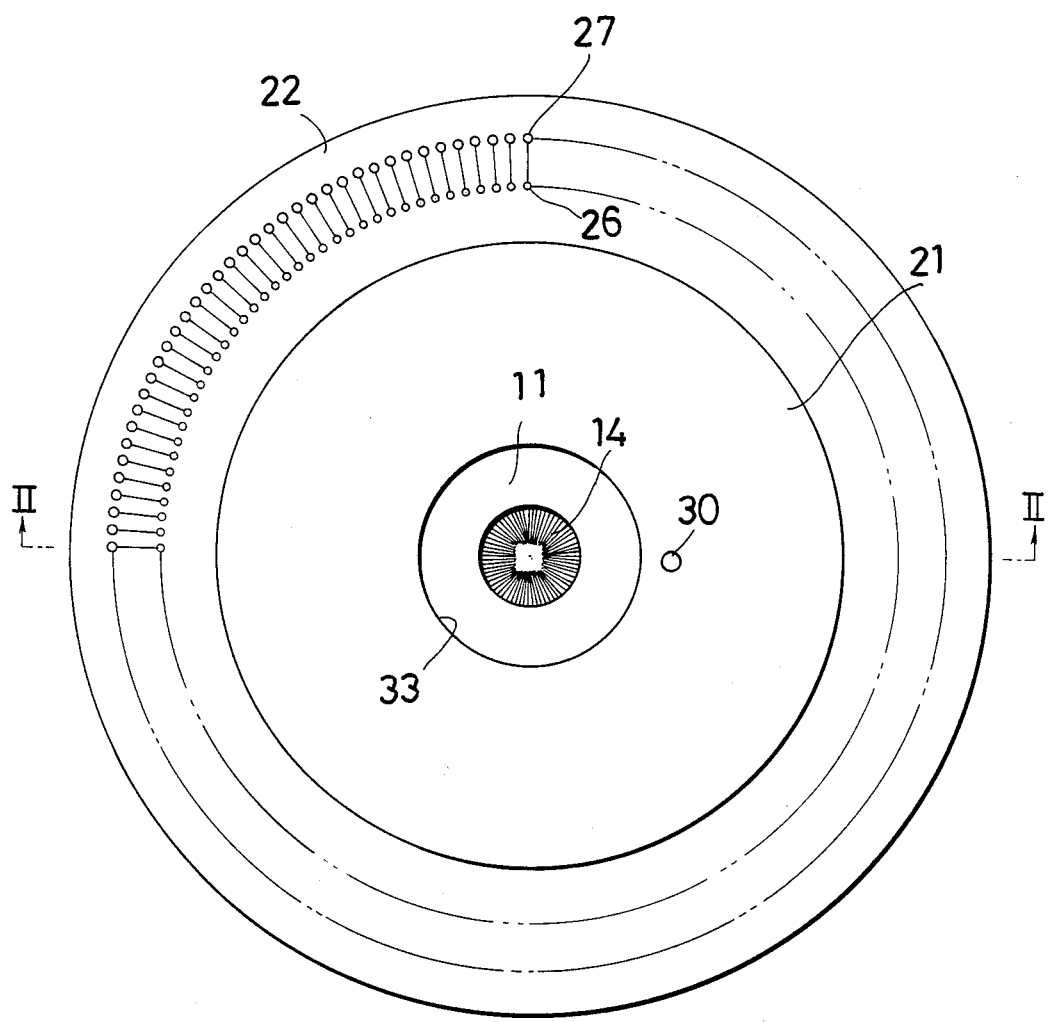
FIG. 1 is a plan view showing a testing apparatus in accordance with the present invention.
Figure 5:
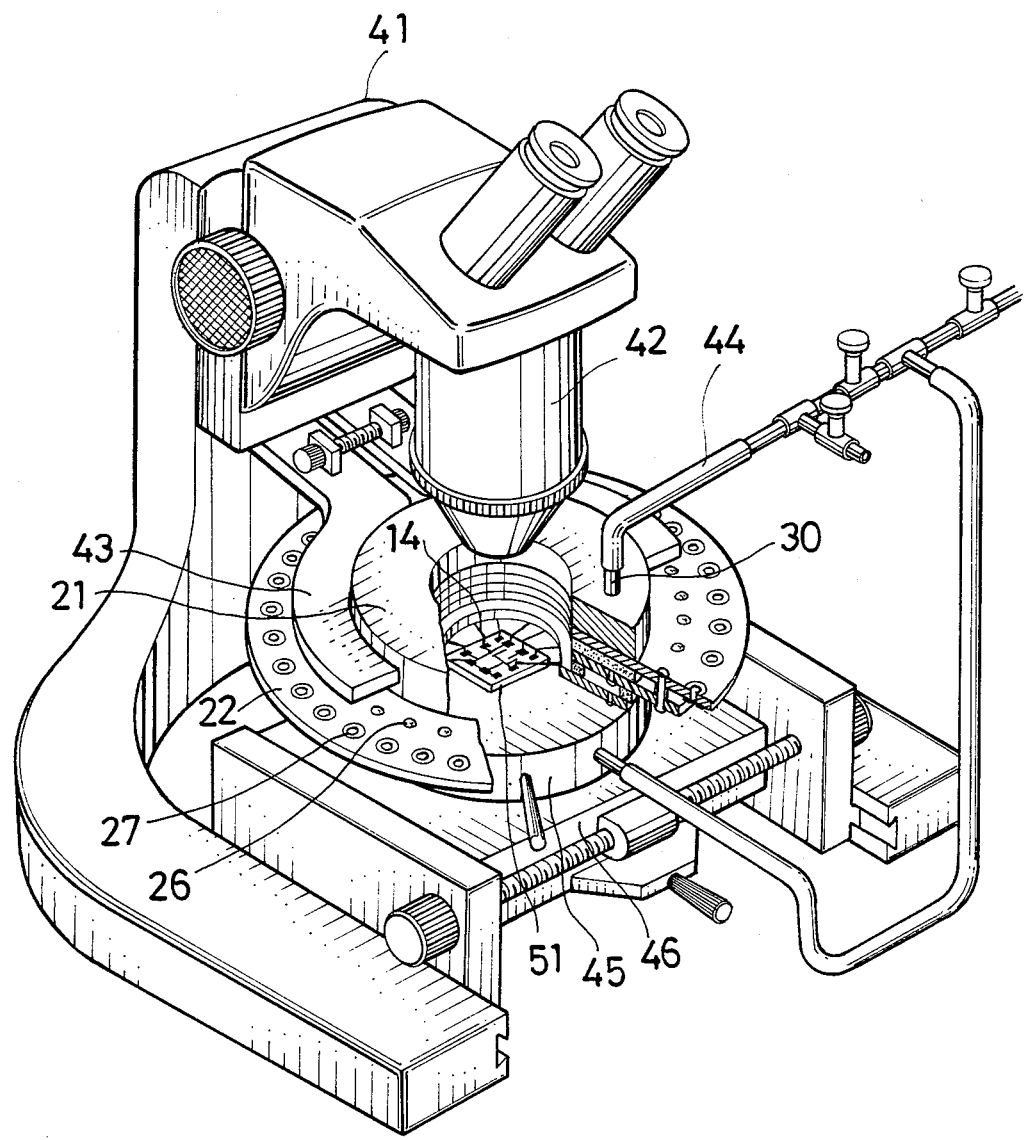
FIG. 5 is a perspective view, partly broken away, showing the testing apparatus in use.

Referring to FIG. 1, the testing apparatus includes a disc-shaped base plate 22 of a hard plastic in which a plurality of lead-out terminals 27 and connecting pins 26 are provided in two concentric circles in the peripheral portion thereof. Each lead-out terminal is electrically connected to each opposing connecting pin 26. The base plate 22 includes a catch portion 21 whereby the testing apparatus is secured to a microscope assembly 41 as shown in FIG. 5, which will be hereinafter referred to. The reference numeral 11 designates a probe card affixed to the base plate 22 at its bottom surface as shown in FIG. 2. In FIG. 1 the central portion of the probe card 11 is seen through a bore 33 in the center of the base plate 22.

The probe card 11 is provided with probe needles 14 radially arranged; in FIG. 1, the end portions of the probe needles 14 are seen through a bore 12 in the center of the probe card 11. As seen in FIG. 1, the terminating ends of the probe needles 14 define a rectangular space (not numbered). These two bores 33 and 12 are concentrically overlapped so as to allow the the examination of the probe needles 14 to be carried out therein with respect to the condition of contact thereof with the testing terminals of a microelectronic device.

Referring now to FIG. 2 the base plate 22 is provided with an elastic sheet 24 on its undersurface, and the elastic sheet 24 is provided with two elastic rings 28 and 29 on its undersurface defining a ring-shaped space 12 between the two rings 28 and 29. The inner ring 28 and the outer ring 29 are made of a thin rubber sheet, and are bonded to the undersurface of the elastic sheet 24. The reference numeral 23 designates a rubber ring, which is optionally provided between the elastic sheet 24 and the base plate 22. The probe card 11 includes terminal contacts 15 each corresponding to one of the respective probe needles 14, and being electrically connected thereto by means of printed wirings. The elastic sheet 24 is fastened to the base plate 22 by means of connecting pins 26, and is also provided with terminal contacts 25 contacting the terminal contacts 15 of the probe card 11. These terminal contacts 25 and 15 are placed into contact with each other so that an electrical connection therebetween is achieved. An electrical connection between the terminal contacts 25 and the connecting pins 26 is achieved through printed wiring provided on the elastic sheet 24. An electrical connection between the connecting pins 26 and the lead-out terminals 27 is achieved through printed wiring provided on the base plate 22. From the lead-out terminals 27 an external connection (not shown) is extended to the the testing device.

Referring to FIG. 3 the structure of the terminal contacts 25 and 15 will be described in greater detail:

The terminal contact 15 includes an electrically conductive member 17 adapted to enable an electrically conductive ball 31 of the terminal contact 25 to engage thereon, the member 17 being secured to the probe card 11 and the ball 31 being mounted on the elastic sheet 24 by the use of a suitable mounting member. The member 17 includes a bore 18 which is airtightly closed by soldering 19. To impart electrical conductivity the surface of the member 17 is gold plated, and its top surface is made flat so as to enable the ball 31 to securely engage thereon.

FIG. 4 illustrates another example of the manner in which the terminal contacts 15 and 25 are contacted. Herein, the ball 31 is replaced by a spring 32 made at a material such as a Au-Cu alloy. This embodiment ensures a face-to-face contact, while the embodiment shown in FIG. 3 ensures a point-to-face or a point-to-point contact.

The base plate 22, the elastic sheet 24, the rubber ring 23, and the inner and outer rings 28, 29 constitute a probe card holder unit. When reference is made to mounting the probe card 11 on the holder unit, it means that the probe card 11 is affixed to the bottom surface of the base plate 22, that is, on the inner and outer rings 28, 29. The manner of mounting the probe card 11 on the rings 28, 29 will be explained in the following paragraph:

Referring again to FIG. 2, there is provided a pipe 30 extending through the base plate 22, the rubber ring 23, and the elastic sheet 24, which pipe 30 opens into the space 12 between the inner and outer rings 28 and 29. The pipe 30 is connected to a suitable air suction means (not shown) so as to produce a vacuum in the space 12 whereby the probe card 11 is held against the inner and outer rings 28 and 29 under the air suction. In this situation the terminal contacts 15 and 25 come into contact with each other, thereby producing electrical contact therebetween. When the probe card 11 is detached, the air suction is stopped. As is evident from the description, it will be appreciated that no mechanical connecting means, such as a plug and jack, are needed.

FIG. 5 shows a manner in which the testing apparatus is actually employed for testing a microelectronic device, which is shown as a semiconductor wafer 51 in the drawing. The testing apparatus is placed under a microscope 42, which is built in a microscope assembly 41. As referred to above, the catch portion 21 of the base plate 22 is grasped by a fork 43 of the microscope assembly 41. The pipe 30 is then connected to an air suction means (not shown) through a tube 44. The air suction means per se is employed for securing the semiconductor wafer 51 on a rotary table 45 under air suction. The probe needles 14 are placed into contact with the testing terminals on the wafer 51. The examination is performed through the microscope 42 to see whether the probe needles 14 are in proper contact with the testing terminals of the wafer 51. A minute adjustment of the position of the wafer 51 can be made by moving the rotary table 45 and/or a slidable table 46. In FIG. 5 the electrical connection between the lead-out terminals 27 and the testing circuit is omitted for simplicity.

According to the present invention the probe card is affixed to the base plate 22 under vacuum, without the use of a known mechanical holding means, thereby avoiding exerting a detrimental force on the probe card when it is attached to or detached from the base plate. The attachment and detachment of the probe card is considerably facilitated regardless of the number of the probe needles.

As referred to above, the base plate 22 is made of a hard insulating material such as plastic, and the probe card is made of a material of the same nature, for example reinforced epoxy resin.

What is claimed is:

1. A testing apparatus for testing semiconductor wafers, said apparatus comprising:
    a base plate of rigid material and having an opening at the center thereof, and a plurality of electrically conductive lead-out terminals on said base plate;
    a sheet of resilient material against said base plate and having an opening concentric with said opening in said base plate, and electrically conductive connecting pins connecting said resilient material sheet to said plate and being electrically connected to corresponding ones of said lead-out terminals;
    at least two sealing sheets of resilient material on the surface of said resilient material sheet facing away from said base plate and spaced from each other along the surface of said resilient material sheet for defining a space therebetween;
    electrically conductive terminal contacts in said resilient material sheet having end portions protruding into said space and said contacts being electrically connected to said connecting pins;
    vacuum means extending through said base plate and said resilient material sheet and communicating with said space for producing a vacuum in said space; and
    a probe card against said two sealing sheets and held there against by the vacuum in said space and having an opening concentric with said opening in said base plate, and a plurality of probe needles thereon extending generally radially into said probe card opening in an arrangement for contacting test terminal of a semi-conductor wafer to be tested, each of said probe needles having a terminal contact with a portion protruding into said space, said terminal contacts being located to contact said terminal contacts on said resilient material sheet for effecting electrical connection therewith when said probe card is against said sealing sheets.

2. A testing apparatus as claimed in claim 1 further comprising a layer of elastic material between said base plate and said resilient material sheet.

3. A testing apparatus as claimed in claim 1 wherein printed wiring connects said lead-out terminals and said connecting pins on said base plate and said connecting pins and said terminal contacts on said resilient material sheet.

4. A testing apparatus as claimed in claim 1 wherein said base plate has a catch means thereon for securing said testing apparatus to a microscope assembly.

5. A testing apparatus as claimed in claim 1 wherein said base plate, said resilient material sheet and said probe card are disc-shaped and said sealing sheets are ring-shaped and are concentric with said space between them being ring-shaped.

* * * * *